United States Patent
Lee et al.

(10) Patent No.: US 9,484,477 B2
(45) Date of Patent: Nov. 1, 2016

(54) SOLAR CELL AND METHOD FOR MANUFACTURING WITH PRE-AMORPHIZATION IMPLANT TO FORM EMITTER

(71) Applicant: LG Electronics Inc., Seoul (KR)

(72) Inventors: Kyoungsoo Lee, Seoul (KR); Seongeun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/605,394

(22) Filed: Jan. 26, 2015

(65) Prior Publication Data

US 2015/0162467 A1    Jun. 11, 2015

Related U.S. Application Data

(62) Division of application No. 13/469,824, filed on May 11, 2012, now Pat. No. 9,029,185.

(30) Foreign Application Priority Data

Dec. 5, 2011    (KR) .................... 10-2011-0129205

(51) Int. Cl.
*H01L 31/06* (2012.01)
*H01L 31/0376* (2006.01)
(Continued)

(52) U.S. Cl.
CPC ......... *H01L 31/0376* (2013.01); *H01L 25/042* (2013.01); *H01L 27/142* (2013.01); *H01L 31/022425* (2013.01); *H01L 31/04* (2013.01); *H01L 31/06* (2013.01); *H01L 31/068* (2013.01);
(Continued)

(58) Field of Classification Search
CPC ..... H01L 31/04; H01L 31/06; H01L 31/068; H01L 27/142
See application file for complete search history.

(56) References Cited

U.S. PATENT DOCUMENTS 4,070,689 A    1/1978    Coleman et al.
5,131,933 A  *  7/1992   Flodl ................ H01L 31/02168
                                                    136/256
(Continued)

FOREIGN PATENT DOCUMENTS

CN    101101797       1/2008
CN    102007599 A     4/2011
(Continued)

OTHER PUBLICATIONS

Yelundur et al., "Implementation of a Homogenous High-Sheet Resistance Emitter in Multicrystalline Silicon Solar Cells", Jan. 2005, Georgia Institute of Technology, p. 959-962.*
(Continued)

*Primary Examiner* — Evan Pert
(74) *Attorney, Agent, or Firm* — LG Electronics Inc.

(57) ABSTRACT

A method for manufacturing a solar cell includes preparing a semiconductor substrate having a first conductivity type dopant; ion-implanting a pre-amorphization elements into a front surface of the semiconductor substrate to form an amorphous layer; and forming an emitter layer by ion-implanting second conductivity type dopant into the front surface of the semiconductor substrate. The method then further includes heat-treating the layers to activate the second conductivity type dopant. The method further includes forming a back surface field layer at a back surface of the semiconductor substrate by ion-implanting a first conductivity type dopant.

8 Claims, 11 Drawing Sheets

(51) Int. Cl.
*H01L 31/04* (2014.01)
*H01L 27/142* (2014.01)
*H01L 31/068* (2012.01)
*H01L 31/18* (2006.01)
*H01L 25/04* (2014.01)
*H01L 31/0224* (2006.01)

(52) U.S. Cl.
CPC ........... *H01L 31/18* (2013.01); *H01L 31/1804* (2013.01); *H01L 31/1876* (2013.01); *H01L 2924/0002* (2013.01); *Y02E 10/547* (2013.01); *Y02P 70/521* (2015.11)

(56) References Cited

U.S. PATENT DOCUMENTS

| | | | | |
|---|---|---|---|---|
| 5,935,345 | A * | 8/1999 | Kuznicki | H01L 31/068 136/255 |
| 6,262,359 | B1 * | 7/2001 | Meier | H01L 31/022425 136/255 |
| 7,776,727 | B2 | 8/2010 | Borden | |
| 7,842,585 | B2 * | 11/2010 | Sivaram | H01L 31/022425 257/E21.001 |
| 8,071,418 | B2 * | 12/2011 | Rohatgi | H01L 21/263 257/E21.147 |
| 8,153,456 | B2 * | 4/2012 | Gupta | H01L 31/1804 257/53 |
| 8,153,496 | B1 * | 4/2012 | Ramappa | H01L 31/0682 257/E21.043 |
| 8,461,011 | B2 * | 6/2013 | Jeon | H01L 31/02363 257/48 |
| 8,900,891 | B2 * | 12/2014 | Pawlak | H01L 31/1804 257/53 |
| 8,967,553 | B2 * | 3/2015 | Asuka | B61L 27/0011 246/167 R |
| 9,136,126 | B2 * | 9/2015 | Wenham | H01L 21/2252 |
| 2009/0068783 | A1 | 3/2009 | Borden | |
| 2009/0227061 | A1 | 9/2009 | Bateman et al. | |
| 2009/0227097 | A1 | 9/2009 | Bateman et al. | |

FOREIGN PATENT DOCUMENTS

| | | |
|---|---|---|
| TW | 200947720 A | 11/2009 |
| WO | 2012/040472 A1 | 3/2012 |
| WO | 2012040472 A1 | 3/2012 |

OTHER PUBLICATIONS

M B Spitzer et al.: "High-efficiency Ion-Implanted Silicon Solar Cells", IEEE Transactions on Electron Devices, vol. 31, No. 5, May 1, 1984, pp. 546-550, XPO55116056, ISSN: 0018-9383, OI:10.1109/T-ED.1984.21567.
C Allebe et al: "Process Integration Towards PERL Structure", Proceedings of the 25th European Photovoltaic Solar Energy Conference, Sep. 6-10, 2010, pp. 1469-1474, XP040531243, ISBN: 978-3-936338-26-3.
"High activity of B during solid-phase epitaxy in a pre-amorphized layer formed by Ge ion implantation and deactivation during a subsequent thermal process". (IEEE Transactions on Electron Devices) 51,5,Kunihiro Suzuki, etc. Dec. 31, 2004, 663-668.
M Hermle et al: N-type Silicon Solar Cells with Implanted Emitter. Proceedings of the 26th European Phtovoltaic Solar Energy conference, Sep. 5-9, 2011, pp. 875-878, XP040637306, ISBN: 978-3-936338-27-0.
T Janssens et al: "Implantation for an Excellent Definition of Doping Profiles in Si Solar Cells", Proceedings of the 25th European Photovoltaic Solar Energy Conference, Sep. 6-10, 2010, pp. 1179-1181, XP040530959, ISBN 978-3-936338-26-3.
Daniel L Meier et al: "N-Type, Ion-Implanted Silicon Solar Cells and Modules", IEEE Journal of Photovoltaics, IEEE, US, vol. 1, No. 2, Oct. 1, 2011, pp. 123-129, XP011390839, ISSN: 2156-3381, DOI: 10.1109/JPHOTOV.2011.2169944 p. 127, right-hand column, paragraph 4; figure 7.
Benick J et al: "Very Low Emitter Saturation Current Densities on ION Implanted Boron emitters" In: Proceedings of the 25th European Photovoltaic Solar Energy Conference, Sep. 6-10, 2010, WIP Renewable Energies, Munich, XP002696810, ISBN: 3-936338-26-4 pp. 1169-1173, DOI: 10.4229/25thEUPVSEC2010-2AO.3.4, The whole document.
Daniel L. Meier et al., "N-Type, Ion-Implanted Silicon Solar Cells and Modules", IEEE Journal of Photovoltaics, IEE, US, vol. 1, No. 2, Oct. 1, 2011, pp. 123-129, XP011390839, ISSN: 2156-3381, DOI: 10.1109/JPHOTOV.2011.2169944, *p. 127, right-hand column, paragraph 4; figure 7*.
Kataoka Y et al., "High activity of B during solid-phase epitaxy in a pre-amorphized layer formed by Ge ion implantation and deactivation during a subsequent thermal process", IEEE Transactions on Electron Devices, IEEE Service Center, Pisacataway, NJ, US, vol. 51, No. 5, May 1, 2004, pp. 663.668, XP011113434, ISSN: 0018-0383, DOI: 10.1109/TED.2004.826864 *pp. 123; figure 1*.
Benick J. et al., "Very Low Emitter Saturation Current Densities on Ion Implanted Boron Emitters" In: Proceedings of the 25th European Photovoltaic Solar Energy Conference, Sep. 6-10, 2010, Valencia, Spain, Sep. 10, 2010, WIP Renewable Energies, Munich, XP002696810, ISBN: 3-936338-26-4, pp. 1169-1173, DOI: 10.4229/25th EUPVSEC2010-2A0.3.4., *the whole document*.
"High Activity of B during solid-phase epitaxy in a pre-amorphized layer formed by Ge ion implantation and deactivation during a subsequent thermal process", (IEEE Transactions on Electron Devices) 51, 5, Kunihiro Suzuki, etc. Dec. 31, 2004, 663-68.

* cited by examiner

SOLAR CELL AND METHOD FOR MANUFACTURING WITH PRE-AMORPHIZATION IMPLANT TO FORM EMITTER

CROSS-REFERENCE TO RELATED APPLICATION

This application is a Divisional of application Ser. No. 13/469,824 filed on May 11, 2012, which claims the priority benefit of Korean Patent Application No. 10-2011-0129205, filed on Dec. 5, 2011, in the Korean Intellectual Property Office, the disclosures of which are incorporated by reference for all purposes as if fully set forth herein.

BACKGROUND

1. Field of the Disclosure

The present disclosure relates to a solar cell and a method for manufacturing the same, and more particularly, to a solar cell and a method for manufacturing the same where an ion-implantation method is applied.

2. Description of the Related Art

In recent times, as it becomes more accepted that conventional energy resources such as petroleum and coal will be exhausted within a foreseeable timeframe, interest in alternative energy sources for replacing the conventional energy resources is gradually increasing. Among them, a solar cell is spotlighted as a new generation cell using a semiconductor device for directly converting solar energy into electrical energy.

A solar cell is manufactured by forming a plurality of layers and patterning them through etching according to a predetermined design. In the manufacturing process, various methods and various process sequences may be applied.

For example, when doping predetermined conductivity type dopants into a semiconductor substrate, an ion-implantation method may be applied. In the ion-implantation method, an ion-beam comprising the dopants is fired at the semiconductor substrate to implant the dopants into the semiconductor substrate. The dopants break a lattice structure inside the semiconductor substrate, and thus necessitate a heat-treatment for recovery of the lattice structure. When a front surface and a back surface of the semiconductor substrate are doped with different dopants, temperatures of the heat-treatment suitable for the different dopants may differ. Generally, the heat-treatment is performed at the higher temperature between the different temperatures. But, the dopants needing to be heat-treated at the lower temperature are excessively diffused into the semiconductor substrate, adversely affecting the properties of the solar cell. Also, the cost increases and the process cannot be easily performed due to the higher temperature.

SUMMARY

This disclosure is directed to a solar cell and a method for manufacturing the same being able to simultaneously heat-treat different dopants having different suitable heat-treatment temperatures at a low temperature.

A method for manufacturing a solar cell according to an embodiment includes preparing a semiconductor substrate having a first conductivity type; ion-implanting a pre-amorphization element into a front surface of the semiconductor substrate to form an amorphous layer; and forming an emitter layer by ion-implanting a second conductivity type dopant into the front surface of the semiconductor substrate.

A solar cell according to another embodiment of the present invention includes a semiconductor substrate having a first conductivity type dopant; an emitter layer formed at a front surface of the semiconductor substrate, the emitter layer comprising a second conductivity type dopant and a pre-amorphization element having an atomic number larger than that of the second conductivity type dopant; a first electrode electrically connected to the emitter layer; and a second electrode electrically connected to the semiconductor substrate.

DETAILED DESCRIPTION

Figure 1:
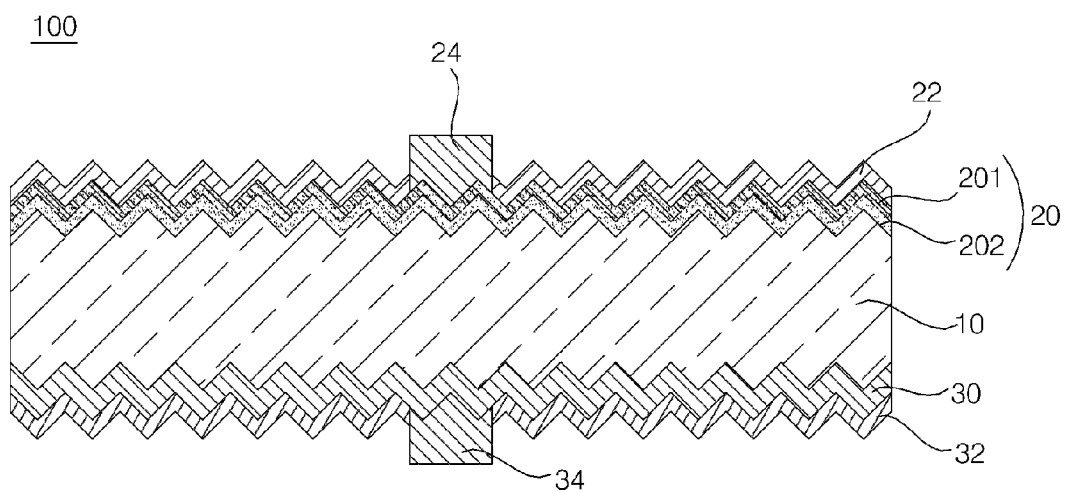
FIG. 1 is a cross-sectional view of a solar cell according to an embodiment of the present invention.

Hereinafter, embodiments of the present invention will be described with reference to the accompanying drawings. However, the present invention is not limited to these embodiments, and various modifications of the exemplary embodiments are possible.

In order to clearly and concisely illustrate the embodiments, elements not related to the present invention are omitted in the figures. Also, elements similar to or the same as each other have the same reference numerals. In addition, the dimensions of layers and regions are exaggerated or schematically illustrated, or some layers are omitted for clarity of illustration. The dimensions of each part as drawn may not reflect an actual size (i.e., not to scale).

In the following description, when a layer or substrate "includes" another layer or portion, it can be understood that the layer or substrate further includes still another layer or portion. Also, when a layer or film is referred to as being "on" another layer or substrate, it can be directly on the other layer or substrate, or intervening layers can also be present. Further, when a layer or film is referred to as being "directly on" another layer or substrate, it can be directly on the other layer or substrate, and thus, there is no intervening layer.

FIG. 1 is a cross-sectional view of a solar cell according to an embodiment of the present invention.

Referring to FIG. 1, a solar cell 100 according to one embodiment includes a semiconductor substrate 10, an emitter layer 20 formed at or adjacent to a first surface (hereinafter, referred to as "the front surface") of the semiconductor substrate 10, and a back surface field layer 30 formed at or adjacent to a second surface (hereinafter, referred to as "the back surface") of the semiconductor substrate 10. Also, the solar cell 100 may include an anti-reflection film 22 and a first electrode 24 (or a plurality of first electrodes) (hereinafter, referred to as "the front electrode") formed on the front surface of the semiconductor substrate 10, and may include a passivation film 32 and a second electrode 34 (or a plurality of second electrodes) (hereinafter, referred to as "the back electrode") formed on the back surface of the semiconductor substrate 10. Next, the detailed structure of the solar cell 100 will be described.

Semiconductor substrate 10 may include various semiconductor materials. For example, the substrate 10 may include silicon having a first conductivity type dopant. For the silicon, single crystal silicon or polycrystalline silicon may be used. The first conductivity type may be an n-type. That is, the semiconductor substrate 10 may include single crystal silicon or polycrystalline silicon having a Group V element, such as phosphorus (P), arsenic (As), antimony (Sb), bismuth (Bi), or the like.

When the semiconductor substrate 10 having n-type dopants as in the above, the emitter layer 20 is formed having p-type dopants at the front surface of the semiconductor substrate 10, and thereby forming a p-n junction. When the sun light is incident on the solar cell 100, the electrons generated by the photoelectric effect move to the back surface of the semiconductor substrate 10, and the holes generated by the photoelectric effect move to the front surface of the semiconductor substrate 10. This migration of electrons and holes generates electric energy.

The holes, having less mobility than the electrons, move to the front surface of the semiconductor substrate 10 and not the back surface. This enhances the conversion efficiency of the solar cell 100.

The front and back surfaces of the semiconductor substrate 10 may be textured surfaces having protruded and/or dented portions of various shapes (such as pyramid shape). The reflectance of the incident sun light at the front surface of the semiconductor substrate 10 can be reduced by the texturing. Thus, the light reaching the p-n junction between the semiconductor substrate 10 and the emitter layer 20 can increase, thereby reducing an optical loss of the solar cell 100.

The back surface field 30 is formed at the back surface of the semiconductor substrate 10, and has the first conductivity type dopant with a doping concentration higher than that of the semiconductor substrate 10. Back surface field 30 can prevent recombination of electron-hole pairs at the back surface of the semiconductor substrate 10, and therefore enhance the efficiency of the solar cell 100. Back surface field 30 may include a group V element, such as phosphorus (P), arsenic (As), antimony (Sb), bismuth (Bi), or the like. For example, in the embodiment, because the phosphorus has an atomic number smaller than the arsenic or the like, the phosphorus may be used for reducing the energy less during ion-implanting. This will be described below in more detail.

For example, when the back surface field layer 30 has an electrical resistance of about 50~100 ohm/square and has a junction depth of about 500 nm~1 μm, the surface concentration of the first conductivity type dopants may be about $10 \times 10^{20}$~$10 \times 10^{22}$/cm$^3$.

The passivation film 32 and the back electrode 34 may be formed at the back surface of the semiconductor substrate 10.

The passivation film 32 may be substantially at the entire back surface of the semiconductor substrate 10, except for the portions where the back electrode 34 is formed. The passivation film 32 elliminates a recombination site of minority carriers existing on the back surface of the semiconductor 10. Thus, an open circuit voltage (Voc) of the solar cell 100 can be increased.

The passivation film 32 may include a transparent insulating material for passing the light. That is, light can be incident to the back surface of the semiconductor substrate 10 through the passivation film 32, and thereby enhance the efficiency of the solar cell 100. The passivation film 32 may have a single film structure or a multi-layer film structure including, for example, at least one material selected from a group consisting of silicon nitride, silicon nitride including hydrogen, silicon oxide, silicon oxy nitride, $MgF_2$, ZnS, $TiO_2$, and $CeO_2$, but is not limited thereto, and thus, the passivation film 32 may include various materials.

The back electrode 34 may include various metals having high electrical conductivity. For example, the back electrode 34 may include silver (Ag) having high electrical conductivity and high reflectance. When the back electrode 34 includes silver having high reflectance, the back electrode 34 can reflect the light toward the back surface of the semiconductor substrate 10. Thus, the amount of the utilized light can be increased.

Back electrode 34 may have a width larger than the front electrode 24. Also, back electrode 34 may have various shapes in a plan view.

The emitter layer 20 having the second conductivity type dopant may be formed at the front surface of the semiconductor substrate 10. Emitter layer 20 may include a p-type dopant such as a group III element, such as boron (B), aluminum (Al), gallium (Ga), or the like. Boron or gallium having a smaller atomic number and being light may be possibly used. In the embodiment, the emitter layer 20 includes the second conductivity type dopant and a pre-amorphization element having an atomic number larger than that of the elements constituting the semiconductor substrate 10.

For amorphization of the semiconductor substrate 10, the pre-amorphization elements may have an atomic number larger than that of the elements constituting the semiconductor substrate 10. Also, the pre-amorphization elements may have similar properties with the semiconductor substrate 10 or may be inert elements not reacting with the semiconductor substrate 10, so that the pre-amorphization elements do not affect the properties (e.g., electrical properties) of the semiconductor substrate 10.

The pre-amorphization elements similar to the semiconductor substrate 10 may be carbon group elements (such as germanium (Ge) or the like) because the silicon constituting the semiconductor substrate 10 is the carbon group element. The inert pre-amorphization elements may be noble gas group elements (such as argon (Ar) or the like).

The emitter layer 20 includes a first layer 201 and a second layer 202. The first layer 201 is adjacent to the front surface of the semiconductor substrate 10 and includes the pre-amorphization elements and the second conductivity type dopants. The second layer 202 is positioned at a portion of the semiconductor substrate 10 deeper than the first layer 201 and includes the second conductivity type dopants without the pre-amorphization elements.

The front surface portion of the semiconductor substrate 10 becomes amorphous by implanting the pre-amorphization elements, and then, the second conductivity type dopants are implanted. The second conductivity type dopants are then diffused deeper into the semiconductor substrate 10 by a activation heat-treatment. The method and the effect of the pre-amorphization elements will be described in more detail in the description of the method for manufacturing the solar cell 100.

A ratio of a total thickness of the emitter layer 20 (that is, the junction depth) to a thickness of the first layer is about 1:0.05~1:0.15. If the ratio is smaller than about 1:0.05, the effect by the pre-amorphization may be insufficient. If the ratio is larger than about 1:0.15, the junction depth after the heat-treatment for activation increases, and control of the junction depth may be difficult.

For example, when the emitter layer 20 may have an electrical resistance of about 50~100 ohm/square and have a junction depth of about 500 nm~1 μm and the surface concentration of the second conductivity type dopants may be about $10 \times 10^{20}$~$10 \times 10^{22}$/cm$^3$.

The anti-reflection film 22 and the front electrode 24 may be formed on the emitter layer 20 at the front surface of the semiconductor substrate 10.

Anti-reflection film 22 may be substantially at the entire front surface of the semiconductor substrate 10, except for the portion where the front electrode 24 is formed. Anti-reflection film 22 reduces reflectance (or reflectivity) of sun light incident to the front surface of the semiconductor substrate 10. Also, the anti-reflection film 22 passivates defects at a surface or a bulk of the emitter layer 20.

Since the reflectance of the sun light is reduced by the anti-reflection film 22, an amount of the sun light reaching the p-n junction formed between the semiconductor substrate 10 and the emitter layer 20 is increased, thereby increasing short circuit current (Isc) of the solar cell 100. Also, because the defects at the emitter layer 20 are passivated, recombination sites of minority carrier are reduced or eliminated, thereby increasing an open-circuit voltage (Voc) of the solar cell 100. Accordingly, the open-circuit voltage (Voc) and the short-circuit current (Isc) of the solar cell 100 are increased by the anti-reflection layer 22, and thus, the efficiency of the solar cell 100 can be enhanced.

Anti-reflection film 22 may include various materials. Anti-reflection film 22 may have a single film structure or a multi-layer film structure including, for example, at least one material selected from a group consisting of silicon nitride, silicon nitride including hydrogen, silicon oxide, silicon oxy nitride, MgF$_2$, ZnS, TiO$_2$, and CeO$_2$, but is not limited thereto, and thus, the anti-reflection film 22 may include various materials.

The front electrode 24 may include various metals having high electrical conductivity. For example, the front electrode 24 may include silver (Ag) having high electrical conductivity, but is not limited thereto. The front electrode 24 may be a single layer including transparent conductive materials, or may have a stacked structure having a transparent conductive layer and a metal layer (called "a bus bar" or "a finger electrode") on the transparent conductive layer.

In the embodiment, emitter layer 20 is formed by sequentially ion-implanting the pre-amorphization elements and the second conductivity type dopants, and the back surface field layer 30 is formed by ion-implanting the first conductivity type dopants. Thus, the portions where emitter layer 20 and back surface field layer 30 are formed can become amorphous, and more dopants can be activated by solid phase epitaxy (SPE) at a low temperature. For example, a ratio of an activation amount by the solid phase epitaxy to an activation amount by the general activation heat-treatment is about 1:0.5~1:0.8. That is, the activation amount by the solid phase epitaxy is considerably larger than that by the general activation heat-treatment. The activation amount will be described in more detail in the description of the method for manufacturing the solar cell 100. In the following description, described portions from above will be omitted, and previously un-described portions from above will be described in more detail.

Figure 2:
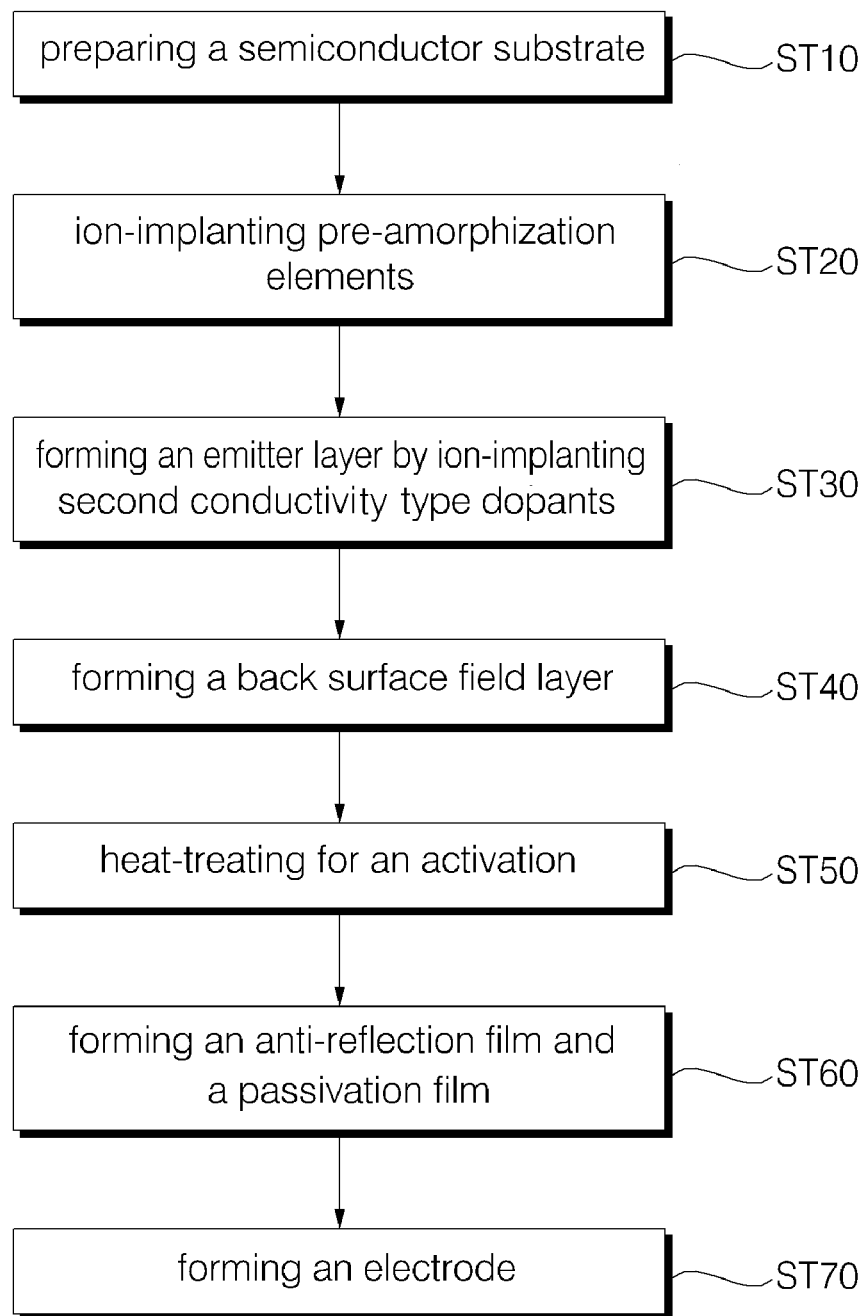
FIG. 2 is a flow chart for illustrating a method for manufacturing a solar cell according to an embodiment of the present invention.

FIG. 2 is a flow chart for illustrating a method for manufacturing a solar cell according to an embodiment. FIGS. 3a to 3g are cross-sectional views for illustrating a method for manufacturing a solar cell according to an embodiment of the present invention.

Referring to FIG. 2, a method for manufacturing a solar cell according to the embodiment includes a step ST10 for preparing a semiconductor substrate, a step ST20 for ion-implanting pre-amorphization elements, a step ST30 for forming an emitter layer by ion-implanting second conductivity type dopants, a step ST40 for forming a back surface field layer, a step ST50 for heat-treating for an activation, a step ST60 for forming an anti-reflection film and a passivation film, and a step ST70 for forming an electrode.

Figure 3A:
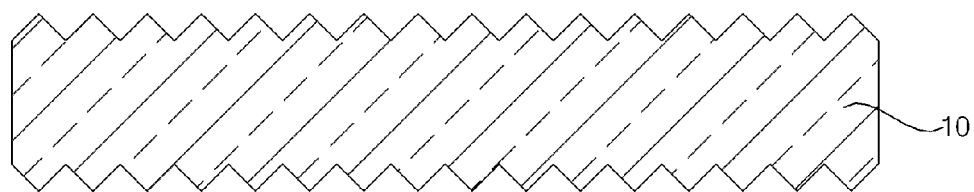
FIGS. 3a to 3g are cross-sectional views for illustrating a method for manufacturing a solar cell according to an embodiment of the present invention.

First, as shown in FIG. 3a, in the step ST10 for preparing the semiconductor substrate, a semiconductor substrate 10 having first conductivity type dopants is prepared. The front and back surfaces of the silicon semiconductor substrate 10 may be textured to have protruded and/or dented portions of various shapes (or to have an uneven surface). The texturing may be created using a wet etching method or a dry etching method. In the wet etching method, the substrate 10 may be dipped into a texturing solution. Wet etching process time can be short. In the dry etching method, the surface of the semiconductor substrate 10 is etched by a diamond drill or a laser. Dry etching can form substantially uniform protruded and/or dented portions, however, the semiconductor substrate 10 may be damaged in the process and the process time may be long. Accordingly, the semiconductor substrate 10 may be textured by various methods.

Figure 3B:
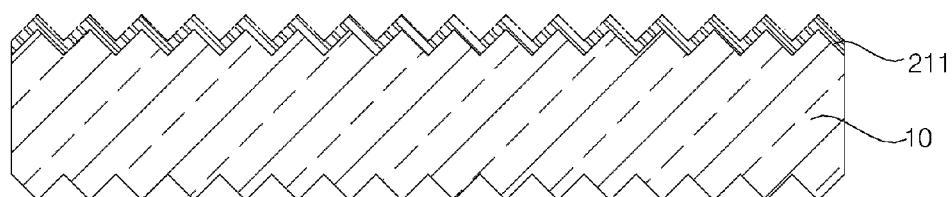

Next, as shown in FIG. 3b, in the step ST20 for ion-implanting the pre-amorphization elements, the pre-amorphization elements are ion-implanted into the front surface of the semiconductor substrate 10. The pre-amorphization element has an atomic number larger than that of the elements (e.g., silicon) constituting the semiconductor substrate 10. The pre-amorphization may be a carbon group element (such as germanium (Ge) or the like) or a noble gas group element (such as argon (Ar) or the like). The ion-implantation forms an amorphous portion or layer 211 is formed at the front portion of the semiconductor substrate 10.

Here, a dose of pre-amorphization elements may be in a range of about $1 \times 10^{14}$/cm$^2$~$3 \times 10^{15}$/cm$^2$. In the above range, the front portion of the semiconductor substrate 10 can become effectively amorphous. The dose of pre-amorphization elements is smaller than that of the first conductivity type dopants for forming a back surface field layer 30. This is because the semiconductor substrate 10 can easily become amorphous by the pre-amorphization elements since the pre-amorphization elements are larger and heavier than the first conductivity type dopants.

Figure 3C:
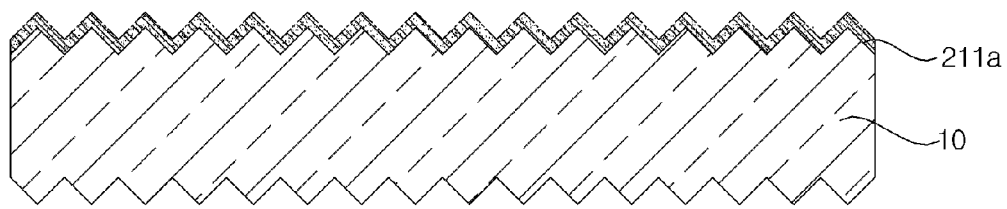

Next, as shown in FIG. 3c, in the step ST30 for forming the emitter layer by ion-implanting the second conductivity type dopants, the second conductivity type dopants such as boron (B) or gallium (Ga) are ion-implanted into the front surface of the semiconductor substrate 10. The second conductivity type dopants are implanted only into the amorphous portion or layer 211.

Thus, by controlling the implantation depth of the pre-amorphization elements, the implantation depth of the second conductivity type dopants can be easily controlled, and thus, it is suitable to form a shallow emitter. On the other hand, in the prior art, since the second conductivity type dopants are implanted without the pre-amorphization elements, it is difficult to control the implantation depth of the second conductivity type dopants by a channeling effect, which will be described later in this disclosure.

The dose of the second conductivity type dopants may be in a range of about $2\times10^{15}/cm^2 \sim 4\times10^{15}/cm^2$. When the dose is above about $4\times10^{15}/cm^2$, the semiconductor substrate 10 that is damaged by the pre-amorphization elements may be damaged more. Also, the above dose range is decided considering a resistance of the emitter layer 20.

Figure 3D:
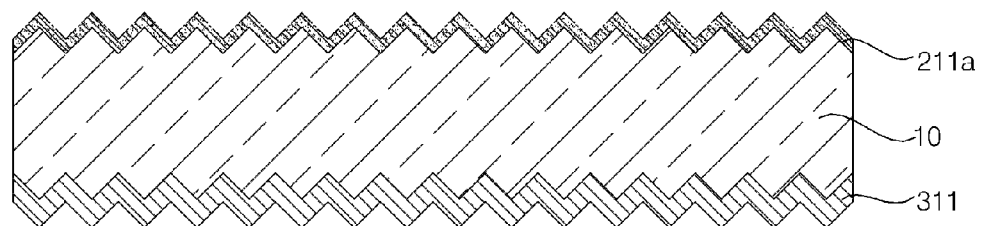

Next, as shown in FIG. 3d, in the step ST40 for forming the back surface field layer, the first conductivity type dopants such as phosphorus (P) are ion-implanted into the back surface of the semiconductor substrate 10. The first conductivity type dopants such as phosphorus (P) are larger and heavier than the silicon constituting the semiconductor substrate 10, and thus, a portion 311 where the first conductivity type dopants are implanted becomes amorphous.

Here, a dose of the first conductivity type dopants (e.g., phosphorus) may be larger than those of the pre-amorphization elements and the second conductivity type dopants. For example, the dose of the first conductivity type dopants (e.g., phosphorus) may be in a range of about $3\times10^{15}/cm^2 \sim 8\times10^{15}/cm^2$. The above dose range is decided for reducing the temperature of the heat-treating for the activation and for increasing an amount of the activated dopants.

Figure 3E:
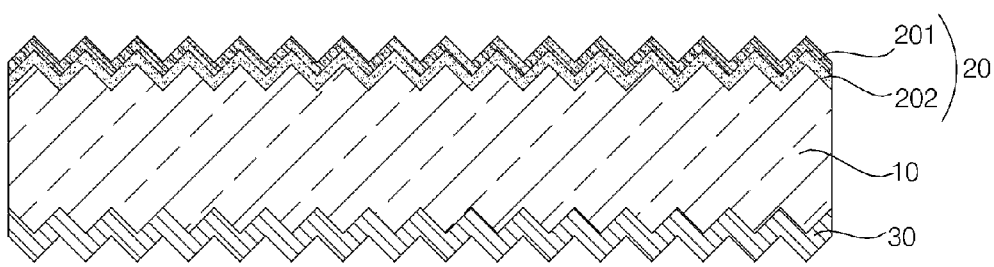

Next, as shown in FIG. 3e, in the step ST50 for heat-treating for the activation, the second conductivity type dopants and the first conductivity type dopants ion-implanted into the semiconductor substrate 10 are simultaneously activated. That is, since the front surface of the semiconductor substrate 10 become amorphous by the pre-amorphization elements and the back surface of the semiconductor substrate 10 become amorphous by the first conductivity type dopants, a growth through solid phase epitaxy (SPE) is induced at the front surface and the back surface of the semiconductor substrate 10 during the heat-treating. Thus, the first conductivity type dopants and the second conductivity type dopants can be activated at the relatively low temperature (e.g., about 400~700° C.) compared to the temperature in the prior art.

When the temperature for heat-treating for the activation is above about 700° C., the problems due to the high temperature may be generated. When the temperature for heat-treating for the activation is below about 400° C., the growth through the solid phase epitaxy is not sufficiently induced.

In the embodiment, because the temperature of the heat-treating for the activation is relatively low, the problems due to the high temperature (e.g., degradation of the semiconductor substrate 10) can be minimized. In addition, by using the solid phase epitaxy, the temperature of the heat-treating for activating the first conductivity type dopants and the temperature of the heat-treating for activating the second conductivity type dopants are similar.

In known processes, the temperature of the heat-treating for activating the second conductivity type dopants is higher than the temperature of the heat-treating for activating the first conductivity type dopants. The temperature of the heat-treating for activating the second conductivity type dopants is often above about 900° C. Thus, since the heat-treating for activating is performed above about 900° C., the first conductivity type dopants are excessively diffused into the semiconductor substrate 10. This leads to difficulty in controlling the doping profile.

On the other hand, in the embodiment, because of the pre-amorphization elements, the temperature of the heat-treating for activating the first conductivity type dopants and the temperature of the heat-treating for activating the second conductivity type dopants are similar. Thus, the first and second conductivity type dopants can be simultaneously heat-treated at the relatively low temperature. Accordingly, co-activation of the first and second conductivity type dopants can be possible, and thus, the process can be simplified and the doping profile can be effectively controlled. This leads to properties of the solar cell being enhanced.

Here, in the heat-treating for forming the emitter layer 20, the second conductivity type dopants are diffused into the semiconductor substrate 10 deeper than the pre-amorphization elements, and the pre-amorphization elements larger than the elements (e.g., silicon) constituting the semiconductor substrate 10 remain at the amorphous portion or layer 211a of FIG. 3d. Accordingly, the second conductivity type dopants are positioned at the semiconductor substrate 10 deeper than the pre-amorphization. Thus, the emitter layer 20 includes a first layer 201 including the pre-amorphization elements and the second conductivity type dopants, and a second layer 202 including the second conductivity type dopants.

The reason for ion-implanting boron (B) or gallium (Ga) to form the emitter layer 20, the reason for using the phosphorus (P) to form the back surface field layer 30, and the reason for using the pre-amorphization will be described in more detail below with reference to FIGS. 4 to 7.

Figure 4:
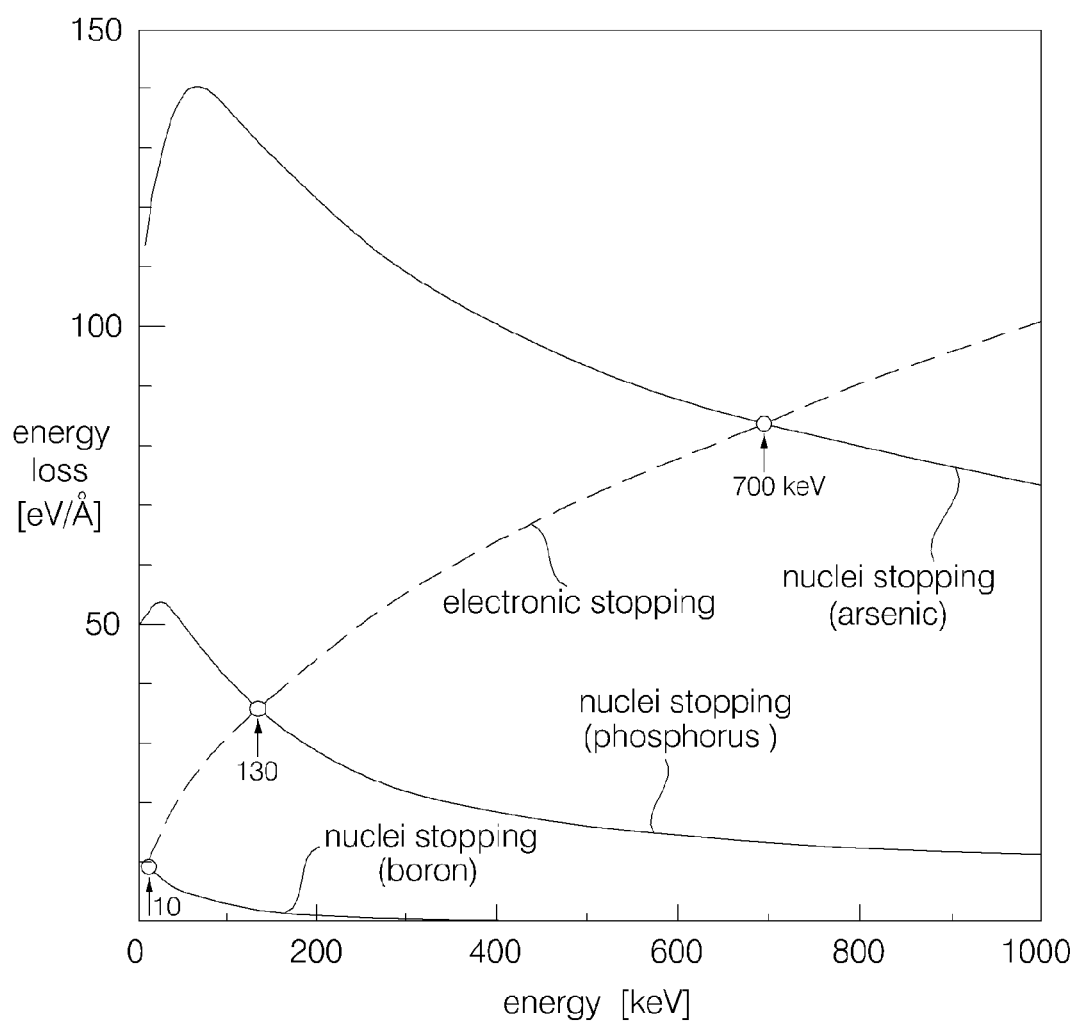
FIG. 4 is a graph illustrating an energy loss induced by nuclei stopping and electronic stopping according to energy, regarding boron, arsenic, and phosphorus.
Figure 5:
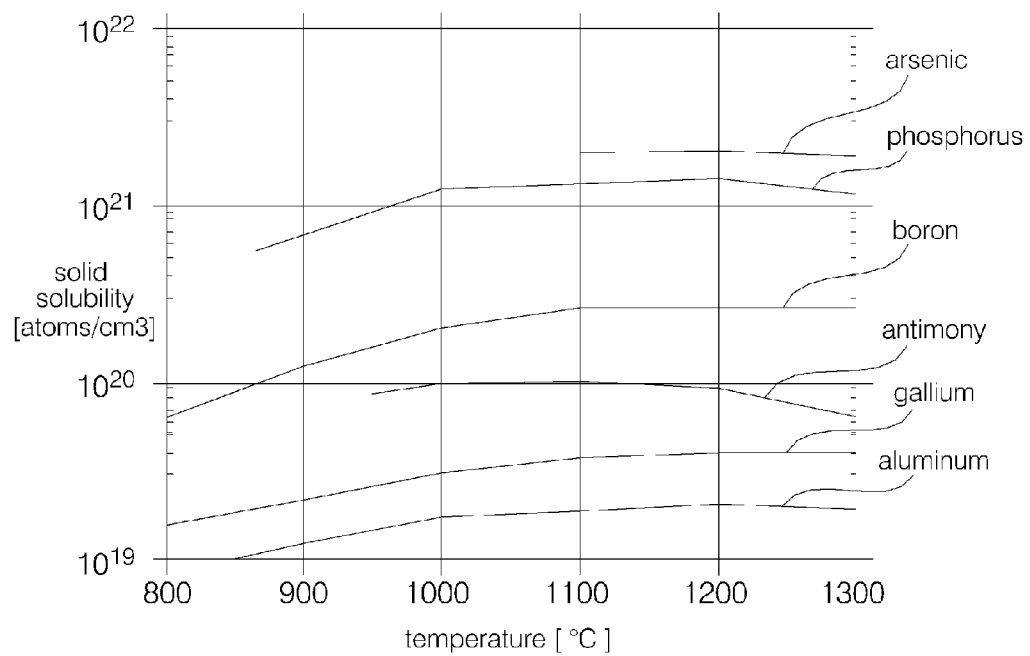
FIG. 5 is a graph illustrating solid solubility of various first and second conductivity type dopants in silicon.
Figure 6:
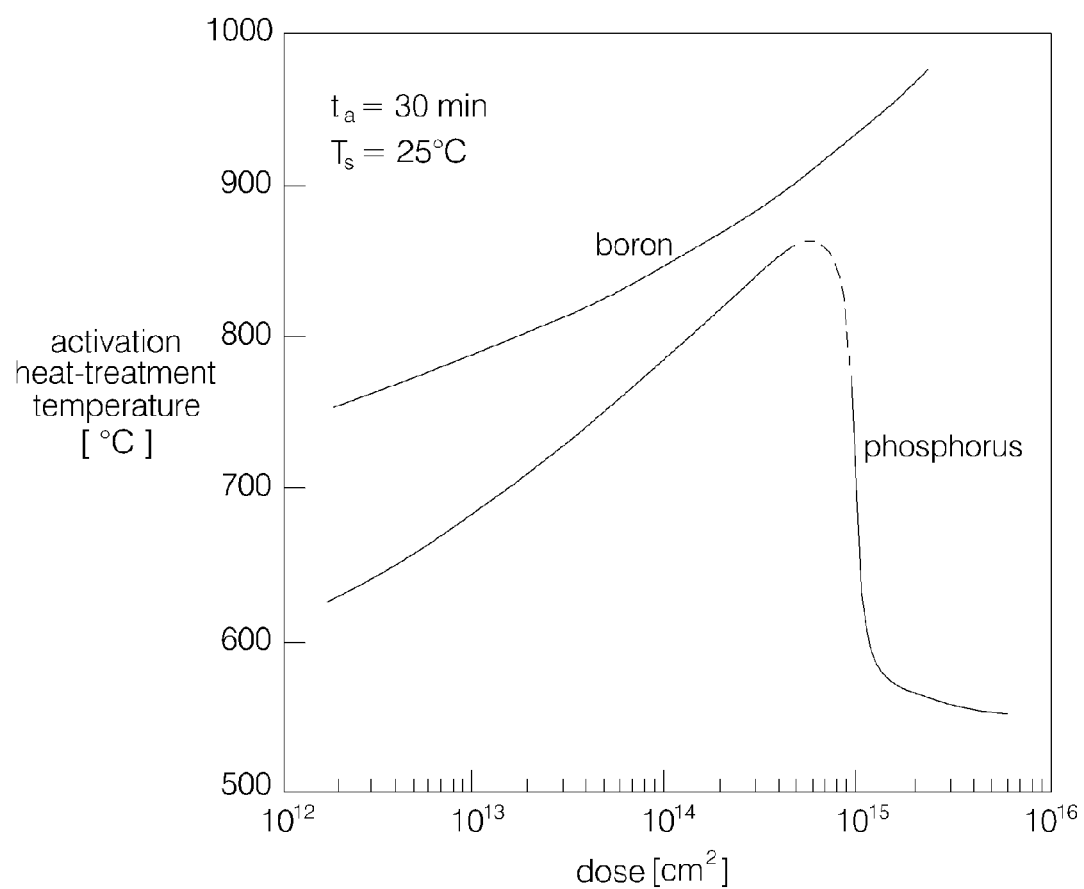
FIG. 6 is a graph illustrating temperature of heat-treating for activating with respect to the dose of boron and phosphorus.
Figure 7:
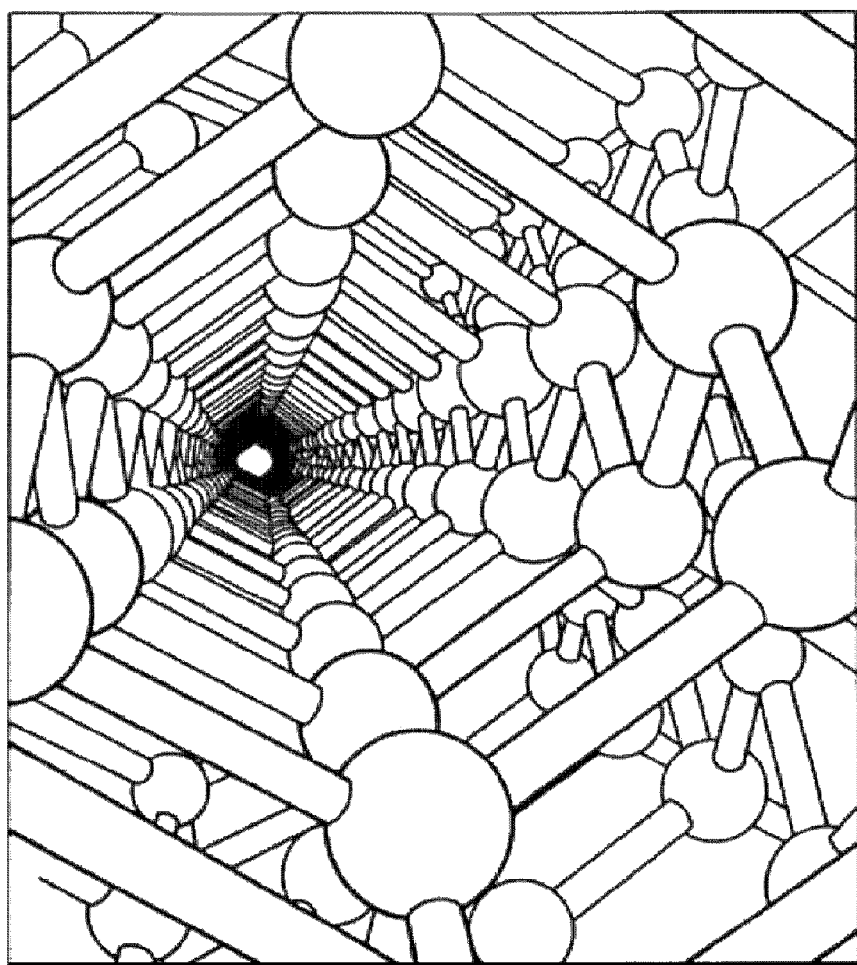
FIG. 7 illustrates channels formed in a <110> direction at a semiconductor substrate including silicon.

FIG. 4 is a graph illustrating an energy loss induced by nuclei stopping and electronic stopping according to energy, regarding boron, arsenic, and phosphorus, and FIG. 5 is a graph illustrating solid solubility of various first and second conductivity type dopants in silicon. FIG. 6 is a graph illustrating temperature of heat-treating for activating according to dose of boron and phosphorus, and FIG. 7 illustrates channels formed in a <110> direction at a semiconductor substrate including silicon.

In the ion-implantation method, the ion is stopped at the semiconductor substrate 10 by the nuclei stopping and the electronic stopping.

The nuclei stopping is induced by mechanical collision of the implanted ion and the nucleus of the semiconductor substrate 10. The elements of the semiconductor substrate 10 move in the lattice, and thus, the damage induced by the implantation is generated. The nuclei stopping linearly increases as initial energy increases at a low energy region, and the nuclei stopping decreases as initial energy increases at a high energy region. This is because 100% of energy cannot be transferred as the time for transferring the energy decreases during the collision. That is, when the initial energy (or ion acceleration energy) is above predetermined energy, the energy loss by the nuclei stopping decreases and a projection range (Rp) (ion-implantation depth) increases. In addition, as the implanted ion becomes heavier, the energy loss by the nuclei stopping increases.

The electronic stopping is induced by ionization of the elements constituting the semiconductor substrate 10 caused by collision of the implanted ion and the electron of the semiconductor substrate 10 due to coulombic interaction. The electronic stopping is proportional to the velocity of the implanted ion, regardless of mass of the implanted ion. Thus, the electronic stopping power increases as the ion acceleration energy increases.

In the case of boron, the cross-ever energy is about 10 keV. Thus, above about 10 keV, the nuclei stopping is hardly induced, and only the electronic stopping is induced. That is, in an energy range of about 30~300 keV that is usually used, boron does not damage the semiconductor substrate 10 and the energy is lost by the electronic stopping. Thus, boron may be implanted by using an energy of about 5~20 keV not to damage the semiconductor substrate 10.

However, when the implant damage by the nuclei stopping is not induced by using the boron that is light and small for forming the emitter layer 20, the boron is activated only by the diffusion. Thus, the activation is not effective. Also, referring to FIG. 5, the second conductivity type dopant such as boron or gallium has small solid solubility in the silicon constituting the semiconductor substrate 10. Thus, the temperature of the heat-treating for activating the second conductivity type dopants is high (e.g., above about 900° C.).

Further, referring to FIG. 6, as the dose of the boron that is the second conductivity type dopant increases, the temperature of the heat-treating for activating increases. This is because the solubility of the boron is low. Thus, the amount of the boron may be minimized not to generate the implant damage, and the boron may be activated by the diffusion.

In addition, when a light ion such as boron is used, the ion can be implanted deeper than a general projection range (or an ion-implantation depth) by the channeling effect according to the ion-implantation direction and the elements arrangement direction. Thus, the doping profile cannot be easily controlled. That is, as shown in FIG. 7, in the semiconductor substrate 10 including the silicon, channels are formed along a <110> direction. Thus, the boron implanted along the channel direction is implanted deeper than the general projection range (or the ion-implantation depth). Because the boron is light and small, the nuclei stopping is hardly induced and the electronic stopping is mostly induced. Thus, the channeling effect can be induced well at the low energy.

Accordingly, in the embodiment, when the emitter layer 20 is formed, the semiconductor substrate 10 becomes amorphous before ion-implanting the second conductivity type dopants, the second conductivity type dopant such as boron is implanted into the amorphous portion or layer, and the heat-treating for activation is performed. Then, the growth through the solid phase epitaxy is induced from the silicon constituting the semiconductor substrate 10. In this case, the silicon constituting the semiconductor substrate 10 acts as the seed. Thus, the activation can be performed at a relatively low temperature.

Meanwhile, regarding the back surface field layer 30, arsenic (As) has an atomic number of 33 and is very heavy (relative atomic mass ~75). Thus, as shown in FIG. 4, in the case of arsenic, the energy loss by the nuclei stopping is mostly induced, and the cross-ever energy is about 700 keV. That is, in an energy range of about 30~300 keV that is usually used, the energy is mostly lost by the nuclei stopping. Phosphorus (P) has an atomic number of 15 and has a medium mass (relative atomic mass ~31). The cross-ever energy of the phosphorus is about 130 keV. Thus, the energy is generally lost by the nuclei stopping below about 130 keV, and the energy is generally lost by the electronic stopping above about 130 keV. Phosphorus may be used as the first conductivity type dopants for forming the back surface field layer 30, since the amount of the energy loss of the arsenic is large.

Also, referring to FIG. 6, in the case of the phosphorus, the temperature for the heat-treating for activation decreases rapidly when the dose is above about $1 \times 10^{15}/cm^2$. This is because the back surface of the semiconductor substrate 10 becomes amorphous by the phosphorus at the above dose range and the growth through the solid phase epitaxy is induced from the silicon constituting the semiconductor substrate 10. In this case, the silicon constituting the semiconductor substrate 10 acts as the seed.

That is, first conductivity type dopants such as phosphorus may be implanted with the dose of about $3 \times 10^{15}/cm^2 \sim 8 \times 10^{15}/cm^2$ by using an energy below about 130 keV to sufficiently damage the back surface of the semiconductor substrate 10. Because of the lattice damage, the growth through the solid state epitaxy can be easily induced.

Figure 3F:
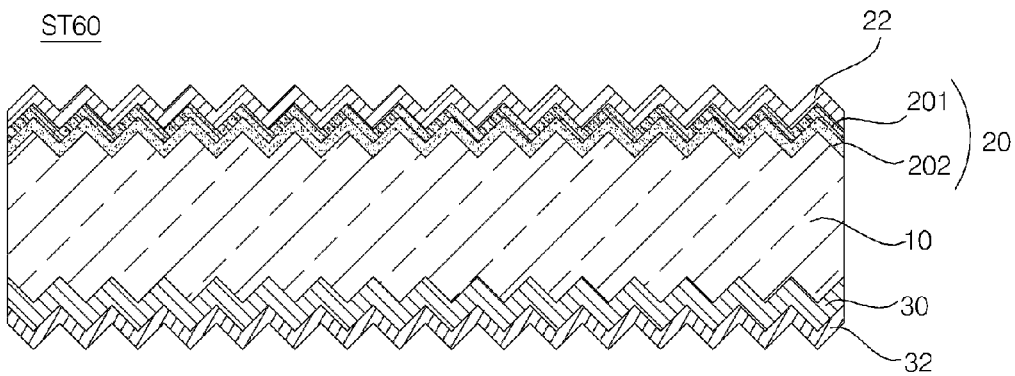
Figure 3G:
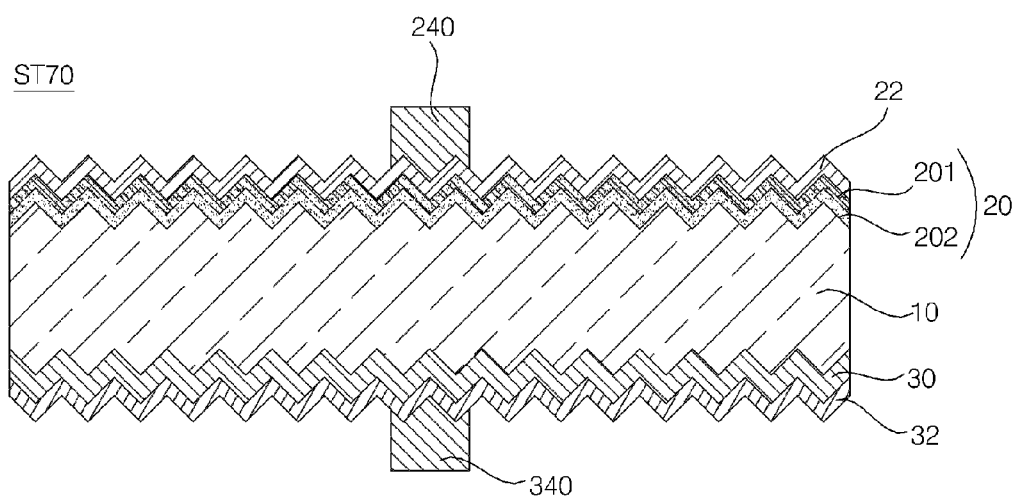

Next, as shown in FIG. 3f, in the step ST60 for forming the anti-reflection film and the passivation film, the anti-reflection film 22 and the passivation film 32 are formed on the front surface and the back surface of the semiconductor substrate 10, respectively. The anti-reflection film 22 and the passivation film 32 may be formed by various methods such as a vacuum evaporation, a chemical vapor deposition, a spin coating, a screen printing, or a spray coating.

Next, in the step ST70 for forming the electrode, a front electrode layer 240 and a back electrode layer 340 are formed on the front surface and the back surface of the semiconductor substrate 10, respectively, and are fired to form a front electrode 24 (shown in FIG. 1) and a back electrode 34 (as shown in FIG. 1).

The front and back electrode layers 240 and 340 may be formed by coating a paste including metal having a high electric property (for example, silver), glass frit, a binder, and a solvent. The front and back electrode layers 240 and 340 are coated on the semiconductor substrate 10 by a printing method. When the front and back electrode layers 240 and 340 are fired, by firing through, the front electrode 24 penetrates the anti-reflection film 22 and is in contact to the emitter layer 20, and the back electrode 34 penetrates the passivation film 32 and is in contact to the back surface field layer 30. Accordingly, the solar cell as shown 100 (shown in FIG. 1) is manufactured.

Figure 8:
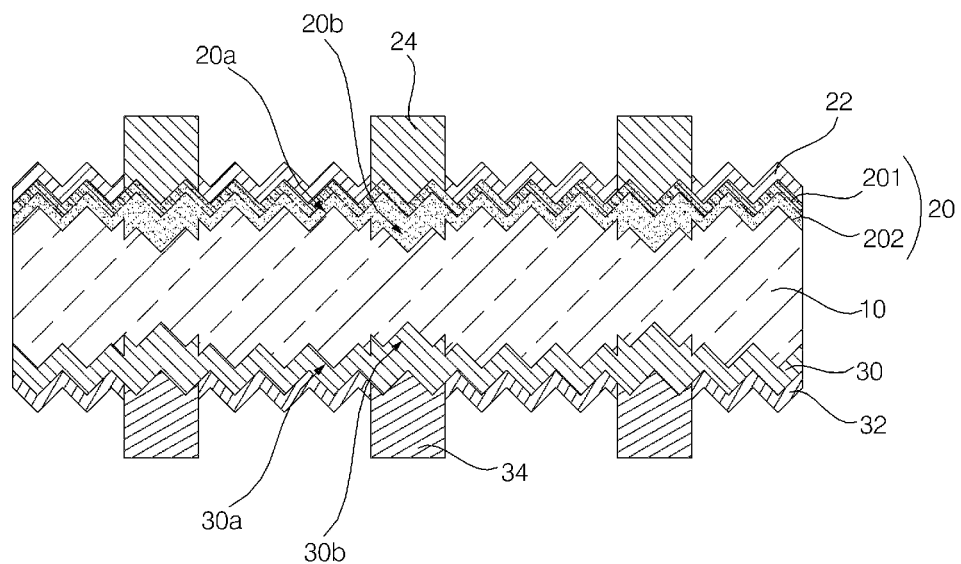
FIG. 8 is a cross-sectional view of a solar cell according to a modified embodiment of the present invention.

In the above embodiment, the emitter layer 20 and the back surface field layer 30 are doped with a uniform doping concentration, and thus, they have a uniform resistance, but is not limited thereto. But, as shown in FIG. 8, an emitter layer 20 can be a selective emitter structure, and a back surface field layer 30 can have a selective back surface field structure.

Particularly, the emitter layer 20 includes a first portion 20a formed adjacent to the anti-reflection film 22 between the front electrodes 24, and a second portion 20b being in contact with the front electrode 24. The second portion 20b has a doping concentration higher than that of the first portion 20a, and thus, the second portion 20b has a resistance lower than that of the first portion 20a.

Then, a shallow emitter can be achieved at the first portion 20a where the sun light is incident, and thereby enhance the efficiency of the solar cell 100a. In addition, contact resistance with the front electrode 24 can be reduced at the second portion 20b being in contact with the front electrode 24. That is, when the emitter layer 20 has the selective emitter structure, the efficiency of the solar cell 100a can be maximized.

In order to form the emitter layer 20, in a step ST20 (of FIG. 2 and FIG. 3b) for forming an emitter layer by ion-implanting a second conductivity type dopants, the second conductivity type dopants is ion-implanted by using a comb mask. The second conductivity type dopants are then ion-implanted with a relatively high doping concentration at a portion corresponding to the second portion 20b. After that, in a step ST50 for heat-treating for activation, the second portion 20b having a relatively low resistance is formed. However, the embodiment is not limited thereto. While one method has been described, emitter layer 20 having the selective emitter structure may be formed by various other methods.

The back surface field layer 30 includes a first portion 30a formed at a portion corresponding to a portion between the back electrodes 34, and a second portion 30b being in contact with the back electrode 34. The second portion 30b has a doping concentration higher than that of the first portion 30a, and thus, the second portion 30b has a resistance lower than that of the first portion 30a.

Then, the first portion 30a of the back surface field layer 30 effectively prevents the recombination of the electrons and the holes, and the contact resistance with the back electrode 34 can be reduced by the second portion 30b having a relatively low resistance. Therefore, the loss by the recombination of the electrons and the holes is reduced, and the electrons or the holes generated by the photoelectric effect can be effectively transferred to the back electrode 34. Accordingly, the efficiency of the solar cell 100a is further improved.

In order to form the back surface field layer 30, in a step ST40 (of FIG. 2 and FIG. 3d) for forming a back surface field layer by ion-implanting a first conductivity type dopants, the first conductivity type dopants are ion-implanted by using a comb mask. The first conductivity type dopants are then ion-implanted with a relatively high doping concentration at a portion corresponding the second portion 30b. After that, in a step ST50 for heat-treating for activation, the second portion 30b having a relatively low resistance is formed. However, the embodiment is not limited thereto. While one method has been described, back surface field layer 30 having the selective back surface field structure may be formed by various other methods.

In the embodiment illustrated by FIG. 8, it is shown that the emitter layer 20 has the selective emitter structure and the back surface field layer 30 has the selective back surface structure. However, it is possible that only one of the emitter layer 20 and the back surface field layer 30 can have the selective structure.

In the embodiment, by using a pre-amorphization element, the temperature of the heat-treating for activating the first conductivity type dopants and the temperature of the heat-treating for activating the second conductivity type dopants are similar. Thus, the first and second conductivity type dopants can be simultaneously heat-treated at the relatively low temperature. Accordingly, co-activation of the first and second conductivity type dopants can be possible, and thus, the process can be simplified and the doping profile can be effectively controlled. Finally, the properties of the solar cell can be enhanced.

Certain embodiments of the invention have been described. However, the invention is not limited to the specific embodiments described above, and various modifications of the embodiments are possible by those skilled in the art to which the invention belongs without leaving the scope of the invention defined by the appended claims. Also, modifications of the embodiments should not be understood individually from the technical principles or prospects of the invention.

What is claimed is:

1. A solar cell, comprising:
a semiconductor substrate having a first conductivity type dopant;
an emitter layer at a front surface of the semiconductor substrate, the emitter layer comprising a second conductivity type dopant and a pre-amorphization element having an atomic number greater than that of the second conductivity type dopant;
a first electrode electrically connected to the emitter layer; and
a second electrode electrically connected to the semiconductor substrate,
wherein the emitter layer comprises:
a first layer adjacent to the front surface of the semiconductor substrate and including the pre-amorphization element and the second conductivity type dopant; and
a second layer at a portion of the semiconductor substrate deeper than the first layer and including the second conductivity type dopant, and
wherein the second layer does not include the pre-amorphization element.

2. The solar cell according to claim 1, wherein the pre-amorphization element comprises an element selected from the group consisting of carbon group elements and noble gas group elements.

3. The solar cell according to claim 2, wherein the pre-amorphization element comprises one of argon (Ar) and germanium (Ge).

4. The solar cell according to claim 1, wherein the semiconductor substrate has an n-type, and wherein the second conductivity type dopant comprises one of boron (B) and gallium (Ga).

5. The solar cell according to claim 1, wherein the second layer has a thickness greater than that of the first layer.

6. The solar cell according to claim 5, wherein a thickness ratio of the emitter layer to the first layer is 1:0.05~1:0.15.

7. The solar cell according to claim 1, wherein the first conductivity type dopant comprises phosphorus (P).

8. The solar cell according to claim 1, wherein the emitter layer has an electrical sheet resistance of 50-100 ohm/square and a junction depth of about 500 nm-1 μm, and a surface concentration of the second conductivity type dopants of $10 \times 10^{20}$~$10 \times 10^{22}$/cm$^3$.

* * * * *